(12) United States Patent
Yoneda

(10) Patent No.: US 9,058,867 B2
(45) Date of Patent: Jun. 16, 2015

(54) SEMICONDUCTOR DEVICE AND DRIVING METHOD THEREOF

(71) Applicant: SEMICONDUCTOR ENERGY LABORATORY CO., LTD., Atsugi-shi, Kanagawa-ken (JP)

(72) Inventor: Seiichi Yoneda, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 168 days.

(21) Appl. No.: 13/900,578

(22) Filed: May 23, 2013

(65) Prior Publication Data

US 2013/0326309 A1   Dec. 5, 2013

(30) Foreign Application Priority Data

Jun. 1, 2012   (JP) .................. 2012-125651

(51) Int. Cl.
| | |
|---|---|
| G11C 14/00 | (2006.01) |
| G06F 1/30 | (2006.01) |
| G06F 11/14 | (2006.01) |
| G06F 11/10 | (2006.01) |
| G06F 1/32 | (2006.01) |
| G06F 1/28 | (2006.01) |
| G06F 12/02 | (2006.01) |
| G11C 11/00 | (2006.01) |
| G11C 5/14 | (2006.01) |

(52) U.S. Cl.
CPC ............... *G11C 14/00* (2013.01); *G06F 11/10* (2013.01); *G06F 1/30* (2013.01); *G06F 1/3206* (2013.01); *G06F 1/3203* (2013.01); *G06F 1/3225* (2013.01); *G06F 1/3275* (2013.01); *G06F 1/3234* (2013.01); *G06F 1/28* (2013.01); *G06F 12/0246* (2013.01); *G11C 11/005* (2013.01); *G06F 11/1441* (2013.01); *G11C 5/144* (2013.01); *Y02B 60/1225* (2013.01); *G06F 11/1048* (2013.01)

(58) Field of Classification Search
CPC ...... G11C 14/00; G11C 11/005; G11C 5/144; G06F 1/30; G06F 1/3206; G06F 1/3203; G06F 1/3234; G06F 1/3225; G06F 1/3275; G06F 1/28; G06F 11/1441; G06F 11/1048; G06F 12/0246; Y02B 60/1225
USPC ........... 714/763, 768, 773, 805, 4.11, 14, 6.1, 714/22, 24; 365/228, 227
See application file for complete search history.

(56) References Cited

U.S. PATENT DOCUMENTS

| | | | | |
|---|---|---|---|---|
| 5,414,861 A | * | 5/1995 | Horning | 365/229 |
| 5,535,399 A | * | 7/1996 | Blitz et al. | 714/6.1 |
| 8,060,781 B2 | * | 11/2011 | Ishikawa et al. | 714/22 |

(Continued)

*Primary Examiner* — John J Tabone, Jr.
(74) *Attorney, Agent, or Firm* — Nixon Peabody LLP; Jeffrey L. Costellia

(57) ABSTRACT

A data saving period control circuit; a power gating control circuit; and a data processing circuit including a general-purpose register, an error correction code storage register, and an error correction code circuit are included. The general-purpose register and the error correction code storage register each include a volatile memory unit and a nonvolatile memory unit. The data saving period control circuit is a circuit for changing a length of a data saving period in which data output from the power gating control circuit is saved from the volatile memory unit to the nonvolatile memory unit included in the general-purpose register, depending on whether an error in an error correction code stored in the error correction code storage register is detected by the error correction code circuit.

16 Claims, 9 Drawing Sheets

(56) References Cited

U.S. PATENT DOCUMENTS

| | | | |
|---|---|---|---|
| 2004/0136273 A1* | 7/2004 | Chambers | 368/9 |
| 2004/0138855 A1* | 7/2004 | Chambers | 702/183 |
| 2008/0086659 A1* | 4/2008 | Ishikawa et al. | 714/22 |
| 2010/0008175 A1* | 1/2010 | Sweere et al. | 365/229 |
| 2012/0054524 A1* | 3/2012 | Ben-Tsion | 713/324 |
| 2012/0084492 A1* | 4/2012 | Stenfort | 711/103 |
| 2012/0170355 A1 | 7/2012 | Ohmaru et al. | |
| 2012/0271990 A1* | 10/2012 | Chen et al. | 711/103 |
| 2014/0250315 A1* | 9/2014 | Stenfort | 713/323 |
| 2015/0033096 A1* | 1/2015 | Radke et al. | 714/773 |

* cited by examiner

SEMICONDUCTOR DEVICE AND DRIVING METHOD THEREOF

BACKGROUND OF THE INVENTION

1. Field of the Invention

The present invention relates to a semiconductor device capable of holding data even when the supply of power is stopped and a method for driving the semiconductor device.

In this specification, a "semiconductor device" means a device which includes a semiconductor element or a circuit which includes a semiconductor element.

2. Description of the Related Art

As for semiconductor devices such as micro processing units (MPUs), improvement of operation frequency and miniaturization of elements have been researched and developed in order to improve performance and reduce power consumption. On the other hand, power consumption of semiconductor devices due to leakage power caused by miniaturization of elements is increased.

Such a problem of increase in power consumption is tried to be solved by a technique for reducing power consumption such as a power gating technique in which supply of power is stopped in a short period during which supply of power is not needed. Further, in recent years, a technique, which is called normally off computing, in which even in a circuit which always needs supply of power, needed data is saved in a nonvolatile memory unit and power is supplied only when necessary has attracted attention.

Patent Document 1 discloses the structure in which a magnetoresistive random access memory (MRAM) is used as a memory element in a nonvolatile memory unit. In Patent Document 1, data is saved from a volatile memory unit to a nonvolatile memory unit immediately before the supply of power is stopped, and the data is restored from the nonvolatile memory unit to the volatile memory unit immediately after the supply of power is resumed.

REFERENCE

[Patent Document 1] PCT international Publication No. 2009/136442

SUMMARY OF THE INVENTION

It is important to set appropriate length of a data saving period to surely save data from the volatile memory unit to the nonvolatile memory unit. That is, the length of the data saving period is preferably set to surely save data from the volatile memory unit to the nonvolatile memory unit. On the other hand, the operation speed of a semiconductor device in which the stop and restart of supply of power are alternately performed is required to be increased. Therefore, the data saving period is required to be short.

However, in the case where the data saving period is set short in advance, there is a problem in that data is not surely saved because of variation or the like in characteristics which is caused in manufacturing the semiconductor device. That is, the data saving period needs to be long since appropriate data saving periods depend on semiconductor devices; accordingly, there is a problem in that the operation speed cannot be increased.

An object of one embodiment of the present invention is to set an appropriate data saving period for saving data from a volatile memory unit to a nonvolatile memory unit in a semiconductor device in which the stop and restart of supply of power are alternately performed, regardless of variation in characteristics in manufacturing the semiconductor device.

One embodiment of the present invention is a semiconductor device which includes a data saving period control circuit; a power gating control circuit; and a data processing circuit including a general-purpose register, an error correction code storage register, and an error correction code circuit. In the semiconductor device, the general-purpose register and the error correction code storage register each include a volatile memory unit and a nonvolatile memory unit. In the semiconductor device, the data saving period control circuit is a circuit for changing a length of a data saving period in which data output from the power gating control circuit is saved from the volatile memory unit to the nonvolatile memory unit included in the general-purpose register, depending on whether an error in an error correction code stored in the error correction code storage register is detected by the error correction code circuit.

The semiconductor device of one embodiment of the present invention preferably has the error correction code circuit which includes an error correction code calculation circuit configured to generate the error correction code; an error correction code comparison circuit configured to output a result of comparing a comparative error correction code and the error correction code stored in the nonvolatile memory unit in the error correction code storage register, the comparative error correction code being calculated using the data stored in the nonvolatile memory unit in the general-purpose register by the error correction code calculation circuit; and a correction circuit configured to correct the data which is stored in the general-purpose register in accordance with the error correction code.

The semiconductor device of one embodiment of the present invention preferably has the data saving period control circuit which includes an error signal memory circuit configured to hold the comparison result, and a data saving period determination flag memory circuit configured to hold a determination flag of the data saving period determined on the basis of the comparison result.

The semiconductor device of one embodiment of the present invention preferably has a power gating circuit including a data saving period counter which is controlled by the data saving period control circuit. The data saving period counter preferably control supply of power to the data processing circuit in accordance with a counted value of the data saving period counter.

The semiconductor device of one embodiment of the present invention preferably has a nonvolatile memory element included in the nonvolatile memory unit, which is a memory element which stores the data and the error correction code by storage of electric charge using a transistor including an oxide semiconductor layer.

One embodiment of the present invention is a method for driving a semiconductor device, the semiconductor device which includes a data saving period control circuit; a power gating control circuit; and a data processing circuit comprising a general-purpose register including a volatile memory unit and a nonvolatile memory unit; an error correction code storage register including a volatile memory unit and a nonvolatile memory unit; and an error correction code circuit. In the method, a step where the power gating control circuit switches whether power is supplied to the data processing circuit and switching data saving and restoration which are conducted between the volatile memory unit and the nonvolatile memory unit is performed; a step where when the error correction code circuit detects an error from an error correction code stored in the nonvolatile memory unit in the error correction code storage register, the data saving period control circuit extends a data saving period for storing data stored from the volatile memory unit to the nonvolatile memory unit in the general-purpose register is performed; and a step where when the error correction code circuit does not detect an error from an error correction code stored in the nonvolatile memory unit in the error correction code storage register, the data saving period control circuit shorten the data saving period for storing data stored from the volatile memory unit to the nonvolatile memory unit in the general-purpose register is performed.

In the method for driving the semiconductor device of one embodiment of the present invention, in which the error correction code circuit comprises an error correction code calculation circuit, an error correction code comparison circuit, and a correction circuit, it is preferable that a step where the error correction code calculation circuit generates an error correction code by using the data stored in the nonvolatile memory unit in the general-purpose register before supply of power to the data processing circuit is stopped is performed; a step where the error correction code comparison circuit outputs a comparison result obtained by comparing a comparative error correction code calculated on the basis of the data stored in the nonvolatile memory unit in the general-purpose register by the error correction code calculation circuit with the error correction code stored in a nonvolatile memory unit in the error correction code storage register is performed; a step where the correction circuit detects an error in the error correction code in the comparison result in the error correction code comparison circuit and, in the case where the data stored in the nonvolatile memory unit in the general-purpose register can be corrected on the basis of the error correction code, correct the data to extend a data saving period for storing the data stored from the volatile memory unit to the nonvolatile memory unit in the general-purpose register is performed; and a step where the correction circuit detects an error in the error correction code in the comparison result in the error correction code comparison circuit and, in the case where the data stored in the nonvolatile memory unit in the general-purpose register cannot be corrected on the basis of the error correction code, the data saving period for storing the data stored from the volatile memory unit to the nonvolatile memory unit in the general-purpose register is extended is performed.

In the method for driving the semiconductor device of one embodiment of the present invention, it is preferable that in the case where the data saving period control circuit does not detect an error in the error correction code stored in the nonvolatile memory unit in the error correction code storage register, the data saving period control circuit determines the length of the data saving period in accordance with whether the error is found in a previous step.

According to one embodiment of the present invention, an appropriate data saving period for saving data from a volatile memory unit to a nonvolatile memory unit in a semiconductor device in which the stop and restart of supply of power are alternately performed can be set, regardless of variation in characteristics in manufacturing the semiconductor device.

DETAILED DESCRIPTION OF THE INVENTION

Figure 1:
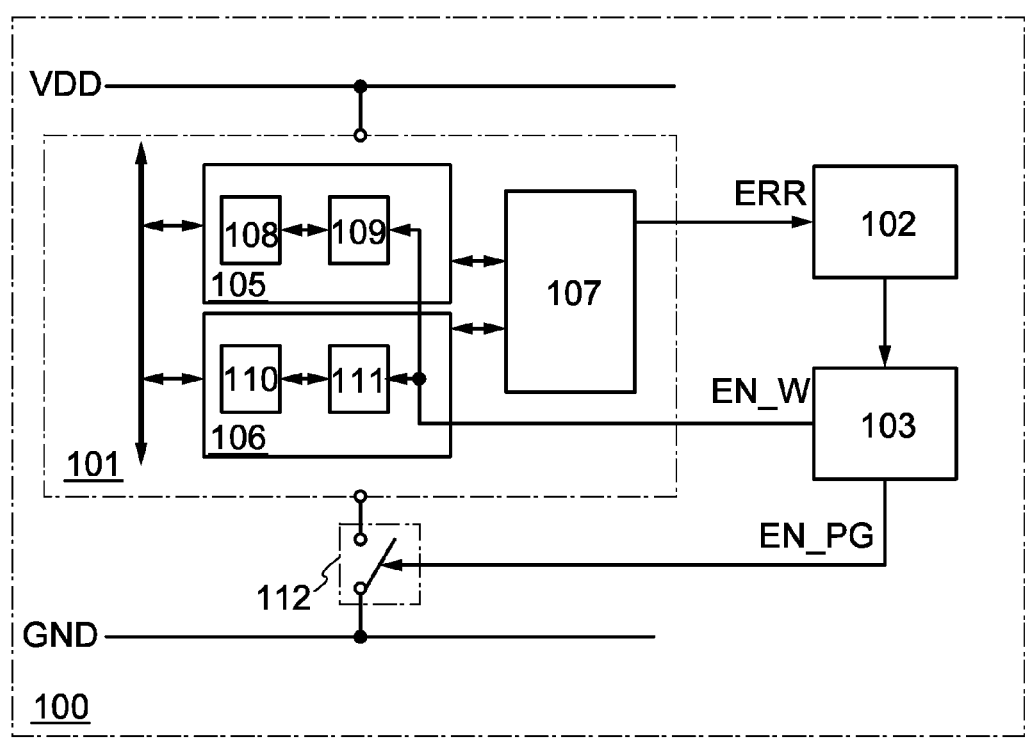
FIG. 1 is a block diagram showing a structure of a semiconductor device.

Hereinafter, embodiments of the present invention will be described with reference to the accompanying drawings. However, the present invention can be carried out in many different modes, and it is easily understood by those skilled in the art that modes and details of the present invention can be modified in various ways without departing from the purpose and the scope of the present invention. Therefore, the present invention should not be construed as being limited to the following description of the embodiments. Note that in structures of the present invention described below, reference numerals denoting the same portions are used in common in different drawings.

Embodiment 1

FIG. 1 is a block diagram of a semiconductor device which can retain data even without supply of power. A semiconductor device 100 illustrated in FIG. 1 includes a data processing circuit 101, a data saving period control circuit 102, and a power gating control circuit 103.

The data processing circuit 101 includes a general-purpose register 105 (also referred to as first register circuit), an error correction code storage register 106 (also referred to as second register circuit), and an error correction code circuit 107. The general-purpose register 105 includes a volatile memory unit 108 and a nonvolatile memory unit 109. The error correction code storage register 106 includes a volatile memory unit 110 and a nonvolatile memory unit 111.

An error signal ERR which is output from the error correction code circuit 107 is input to the data saving period control circuit 102.

The power gating control circuit 103 outputs a data saving signal EN_W for changing the length of a data saving period in accordance with a control signal output from the data saving period control circuit 102. The signal is input to the nonvolatile memory unit 109 and the nonvolatile memory unit 111. The power gating control circuit 103 also outputs a power gating control signal EN_PG for controlling switching of a switch 112, that is, for controlling stopping or resuming the supply of power to the data processing circuit 101.

The switch 112 is provided between a wiring for supplying a high power supply voltage VDD and a wiring for supplying a ground potential GND. The supply of power to the data processing circuit 101 can be controlled by switching of the switch 112. Note that the ground potential GND can be replaced with a low power supply voltage VSS.

The data processing circuit 101 performs arithmetic processing on data which is input according to a predetermined program, and then outputs the data. Although not illustrated in FIG. 1, the data processing circuit 101 further includes an arithmetic unit, an arithmetic register, an instruction register, an instruction decoder, a control unit, an address administration unit, and the like in addition to the general-purpose register 105, the error correction code storage register 106, and the error correction code circuit 107. A circuit included in the data processing circuit 101 can input or output data through an internal bus (represented by a bold arrow in FIG. 1) or the like. In the data processing circuit 101, data can be retained in the general-purpose register 105.

The general-purpose register 105 stores data or program which is input to the data processing circuit 101, or data obtained by calculation in the data processing circuit 101. The general-purpose register 105 includes the volatile memory unit 108 and the nonvolatile memory unit 109.

The error correction code storage register 106 stores an error correction code (ECC) which is calculated in the error correction code circuit 107 on the basis of the data stored in the general-purpose register 105. The error correction code storage register 106 includes the volatile memory unit 110 and the nonvolatile memory unit 111, like the general-purpose register 105.

Note that the error correction code may be Hamming codes, for example. Another correction code may be used as long as it can correct an error by comparing the calculation results of two codes.

The error correction code can be replaced with an error detection code. In other words, the error correction code circuit 107 in FIG. 1 can be replaced with an error detection code circuit and the error correction code storage register 106 can be replaced with an error detection code storage register.

An error detection code contains smaller amount of data than the error correction code. Therefore, the area of the circuit can be reduced in such a manner that the error correction code storage register 106 and the error correction code circuit 107 are replaced with an error detection code storage register and an error detection code circuit, respectively. Thus, the area of the semiconductor device 100 can be reduced.

The error detection code may be cyclic redundancy check (CRC), for example. Another correction code may be used as long as it can correct an error by comparing the calculation results of two codes.

The volatile memory unit 108 in the general-purpose register 105 is a memory unit which stores data during the supply of power. The volatile memory unit 110 in the error correction code storage register 106 is a memory unit which stores data during the supply of power. For example, the volatile memory units 108 and 110 each can be formed using a flip-flop. The data storage operation using the volatile memory units 108 and 110 is preferably performed more quickly than that using the nonvolatile memory units 109 and 111. High-speed data storage operation using the volatile memory units 108 and 110 enables the operation in the data processing circuit 101 to be performed at higher speed.

The nonvolatile memory unit 109 in the general-purpose register 105 is a memory unit which stores data during stop of supply of power. The nonvolatile memory unit 111 in the error correction code storage register 106 is a memory unit which stores data during stop of supply of power. For example, the nonvolatile memory units 109 and 111 can be formed using a flash memory, a ferroelectric memory (FeRAM), a magnetic memory (MRAM), a phase change memory (PRAM), or a resistance random access memory (ReRAM) utilizing colossal electro resistance. The memory element may be any memory element as long as it can hold data even when power is not supplied.

The error correction code circuit 107 includes an error correction code calculation circuit for calculating the error correction code on the basis of data stored in the general-purpose register 105. The error correction code circuit 107 also includes an error correction code comparison circuit which outputs the error signal ERR to the data saving period control circuit 102. The error signal ERR is obtained by comparing the error correction code stored in the nonvolatile memory unit 111 with the result of calculation in the error correction code calculation circuit. The error correction code circuit 107 includes a correction circuit which corrects data stored in the general-purpose register 105, by the error correction code in the case where the error signal ERR is generated in the error correction code comparison circuit.

The data saving period control circuit 102 is a circuit which outputs a signal for changing the length of the data saving period controlled, in accordance with whether the error signal ERR is output from the error correction code comparison circuit in the error correction code circuit 107. Specifically, the data saving period control circuit 102 outputs a control signal for performing addition or subtraction on a data saving period counter in the power gating control circuit 103, in accordance with whether the error signal ERR is generated.

The data saving period control circuit 102 also includes a comparison result memory unit which keeps the presence or absence of the error signal ERR and a data saving period determination flag memory circuit which determines the length of the data saving period depending on whether the error signal ERR is generated.

The power gating control circuit 103 includes a data saving period counter on which addition and subtraction of a counted value is controlled by the data saving period control circuit 102. The power gating control circuit 103 can change the length of the data saving period depending on a counted value of the data saving period counter. The data saving signal EN_W is output to the nonvolatile memory units 109 and 111. For example, a period where an H-level signal is output is controlled on the basis of a counted value of the data saving period counter, whereby the power gating control circuit 103 can change the length of the data saving period based on the data saving signal EN_W.

The power gating control circuit 103 outputs the power gating control signal EN_PG for controlling the stop or resuming of the supply of power to the data processing circuit 101. The power gating control signal EN_PG may be a signal for controlling the switch 112 to be off so that the supply of power is stopped, in the case where data is not input nor output to the data processing circuit 101 for a certain time.

Figure 2:
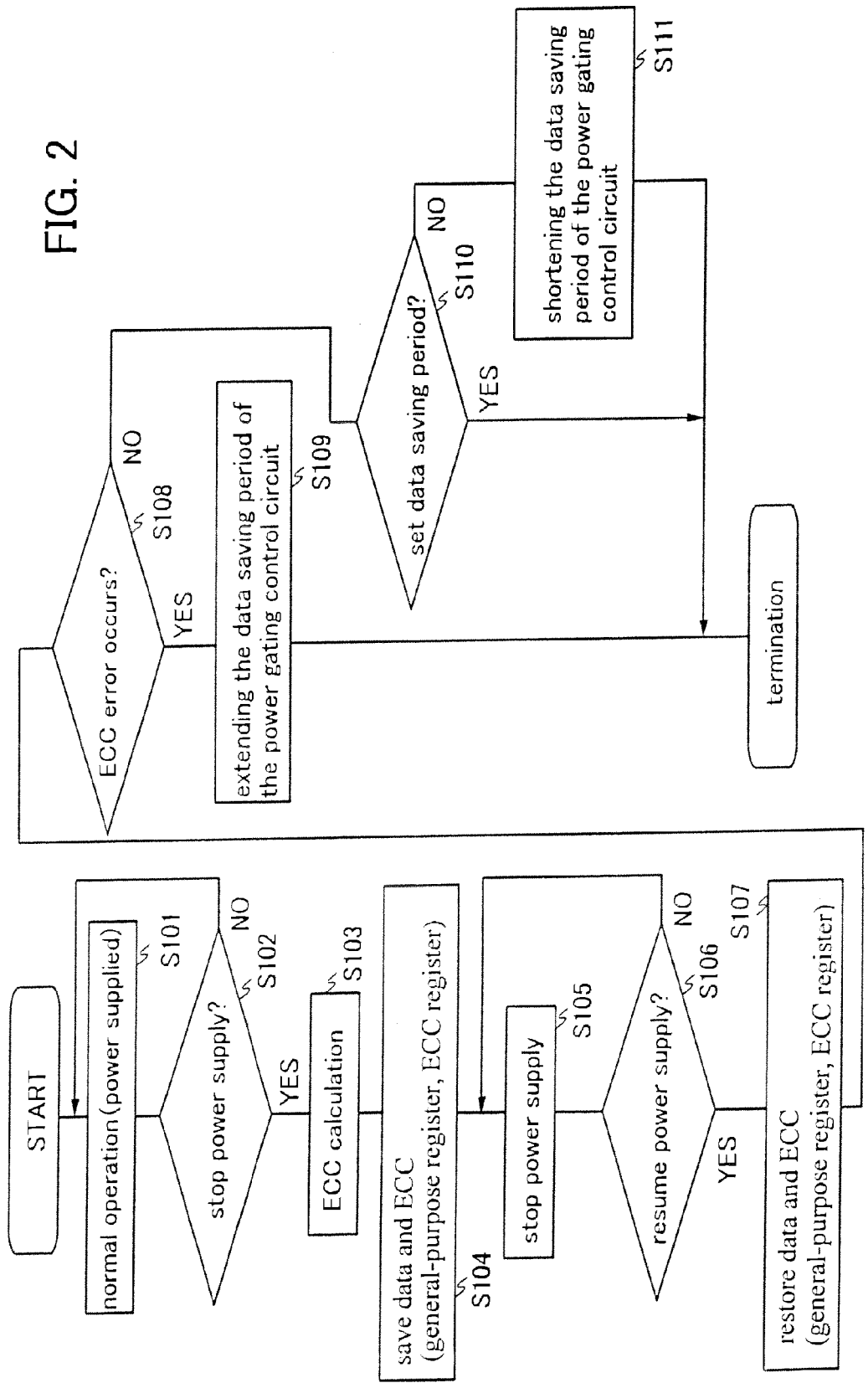
FIG. 2 is a flowchart showing an operation of a semiconductor device.

Next, FIG. 2 is a flowchart showing an example of the operation of the semiconductor device 100 in FIG. 1.

In the flowchart in FIG. 2, as an initial state, power is supplied and data is stored in a volatile memory unit as a normal operation. Each step in the following process is described with reference to FIG. 2: the process is started from the normal operation, data saving operation where data is saved on a nonvolatile memory unit and the supply of power is stopped, and then the saved data is restored to the volatile memory unit; then, the length of the data saving period for storing data in the nonvolatile memory unit is changed.

In a step S101, the normal operation is shown as an initial state. Data processed in the data processing circuit 101 at this time is stored in the volatile memory unit 108 in the general-purpose register 105. The operation of storing data in the volatile memory unit 108 can be performed at higher speed than in the nonvolatile memory unit 109. Thus, the operation speed of the data processing circuit 101 can be increased.

In a step S102, in the normal operation, whether the supply of power is stopped is determined. In the case of stopping the supply of power, the process moves on to a step S103. In the case of continuing the supply of power, the step S101 and the step S102 are repeated.

In the step S103, before the supply of power to the data processing circuit 101 is stopped, the error correction code (abbreviated to ECC in FIG. 2) is calculated with the error correction code circuit 107 on the basis of data stored in the volatile memory unit 108 in the general-purpose register 105. The error correction code obtained by the calculation is stored in the volatile memory unit 110 in the error correction code storage register 106.

In a step S104, the data stored in the volatile memory unit 108 in the general-purpose register 105 and the error correction code stored in the volatile memory unit 110 in the error correction code storage register 106 are saved on the nonvolatile memory units 109 and 111, respectively. The process can be performed by outputting the data saving signal EN_W from the power gating control circuit 103 to the nonvolatile memory units 109 and 111. At this time, to increase processing speed of the data processing circuit 101, it is preferable that the data saving period be short as long as the data can be saved.

In a step S105, processing for stopping the supply of power is performed. The processing can be achieved by turning off the switch 112 by the power gating control signal EN_PG output from the power gating control circuit 103. Note that the data in the general-purpose register 105 and the error correction code in the error correction code storage register 106 are stored in the nonvolatile memory units, and accordingly, are retained even after the supply of power is stopped.

In a step S106, in the normal operation, whether the supply of power is stopped is determined. In the case of stopping the supply of power, the process moves on to a step S107. In the case of resuming the supply of power, the step S105 and the step S106 are repeated.

In the step S107, the data stored in the nonvolatile memory unit 109 in the general-purpose register 105 and the error correction code stored in the nonvolatile memory unit 111 in the error correction code storage register 106 are restored to the volatile memory units 108 and 110, respectively.

In a step S108, the error correction code which is restored to the volatile memory unit 110 in the error correction code storage register 106 and a comparative error correction code which is calculated on the basis of the data which is restored to the volatile memory unit 108 are compared to determine whether an error occurs in the error correction code. In the case where an error occurs in the error correction code, the process moves on to a step S109. In the case where an error does not occur in the error correction code, the process moves on to a step S110.

In the case where the data saving period is long, an error hardly occurs in the step S108 because data can be surely saved from the volatile memory unit to the nonvolatile memory unit. On the other hand, in the case where the data saving period is short, sometimes data is not saved from the volatile memory unit to the nonvolatile memory unit because of variation in characteristics which is caused in manufacturing a semiconductor device and the setting of operation speed.

In the case where an error occurs in the error correction code, the power gating control circuit 103 performs processing for extending the data saving period in the step S109.

In the case where an error occurs in the step S108, data is not saved from the volatile memory unit to the nonvolatile memory unit because the data saving period which is previously set is short. Accordingly, by extending the data saving period based on the data saving signal EN_W in the step S109, the data can be surely saved from the volatile memory unit to the nonvolatile memory unit next time.

In the case where an error does not occur in the error correction code, whether the length of the data saving period is set is determined in the step S110. The processing is terminated when the length of the data saving period is set. The process moves on to a step S111 when the length of the data saving period is not set.

In the case where the length of the data saving period is set in the step S110, data can be saved from the volatile memory unit to the nonvolatile memory unit because the length of the data saving period which is previously set is appropriate or longer than the appropriate length. Therefore, when the length of the data saving period is set in the step S110 to be short to increase the operation speed and to enable data to be surely saved from the volatile memory unit to the nonvolatile memory unit, the processing is terminated.

In the step S111, the power gating control circuit 103 performs processing for shortening the data saving period. The entire processing is terminated after the step S111.

In the case where an error does not occur and the length of the data saving period is not determined in the step S111, data is not saved from the volatile memory unit to the nonvolatile memory unit because the length of the data saving period which is previously set is appropriate or longer than the appropriate length. Accordingly, by shortening the data saving period based on the data saving signal EN_W in the step S111, the operation speed can be increased when the data is saved from the volatile memory unit to the nonvolatile memory unit next time.

The above is the description on the flowchart which shows an example of the operation of the semiconductor device 100 illustrated in FIG. 1.

With the structure described in this embodiment, an appropriate data saving period for saving data from a volatile memory unit to a nonvolatile memory unit in a semiconductor device in which the stop and restart of supply of power are alternately performed can be set, regardless of variation in characteristics in manufacturing the semiconductor device.

Embodiment 2

In this embodiment, a more specific structure and the operation of the semiconductor device described in Embodiment 1 will be described in detail. Note that components which are the same as those in Embodiment 1 are denoted by the same reference numerals, common description between Embodiment 1 and this embodiment will be omitted, and the above description in Embodiment 1 is to be referred to.

Figure 3:
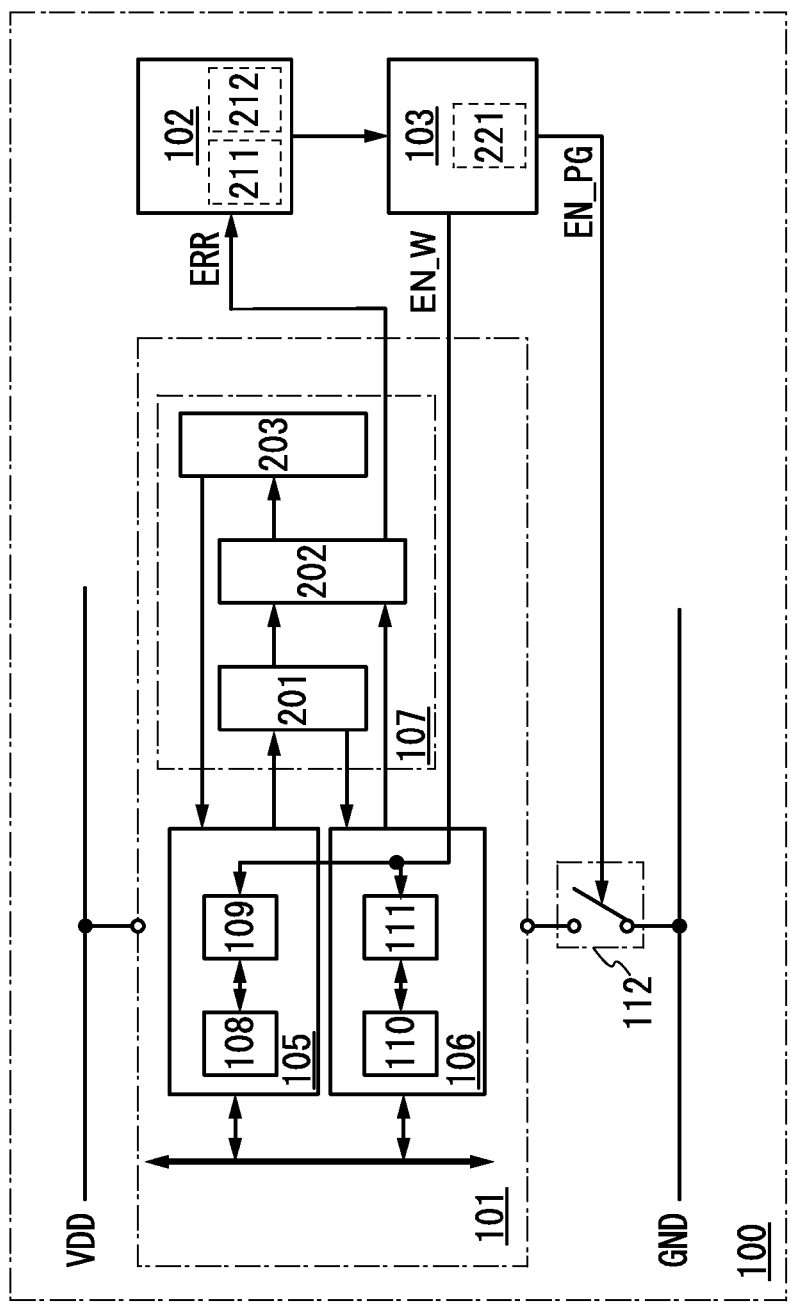
FIG. 3 is a block diagram showing a structure of a semiconductor device.

FIG. 3 is a block diagram of a semiconductor device which can retain data even without supply of power. The block diagram of FIG. 3 illustrates the detailed structures of the error correction code circuit 107, the data saving period control circuit 102, and the power gating control circuit 103 in the semiconductor device 100 in FIG. 1.

The error correction code circuit 107 includes an error correction code calculation circuit 201, an error correction code comparison circuit 202, and a correction circuit 203.

The data saving period control circuit 102 includes an error signal memory circuit 211 and a data saving period determination flag memory circuit 212.

The power gating control circuit 103 includes a data saving period counter 221.

An error signal ERR output from the error correction code comparison circuit 202 in the error correction code circuit 107 is input to the data saving period control circuit 102. The result of comparing the restored data of the error correction code based on the error signal ERR with the result calculated in the error correction code calculation circuit 201 is stored in the error signal memory circuit 211. Storage of the determination flag in the data saving period determination flag memory circuit 212 is determined in accordance with the comparison result stored in the error signal memory circuit 211 and the error signal ERR which is input after the comparison result.

A control signal output from the data saving period control circuit 102 is input to the power gating control circuit 103 in accordance with whether the error signal ERR is in the data saving period control circuit 102, whether the previous error signal ERR is stored in the error signal memory circuit 211, and a determination flag stored in the data saving period determination flag memory circuit 212. A counted value of the data saving period counter 221 is incremented or decremented in accordance with the control signal. The data saving signal EN_W whose period of H-level output is changed in accordance with the counted value of the data saving period counter 221 is output to the nonvolatile memory units 109 and 111.

The error correction code calculation circuit 201 is a circuit for calculating the error correction code on the basis of the data stored in the general-purpose register 105. As the error signal ERR, the error correction code comparison circuit 202 outputs the result of comparing the error correction code stored in the nonvolatile memory unit 111 with the comparative error correction code, which is calculated by the error correction code calculation circuit 201 on the basis of the data restored from the volatile memory unit 108, to the data saving period control circuit 102. The correction circuit 203 is a circuit for correcting the data, which is stored in the general-purpose register 105, by the error correction code in the case where the error signal ERR is generated by the error correction code comparison circuit 202.

The error signal memory circuit 211 in the data saving period control circuit 102 keeps the presence or absence of the error signal ERR in the previously performed processing. In addition, the data saving period determination flag memory circuit 212 in the data saving period control circuit 102 generates and stores a flag to determine the length of the data saving period in accordance with whether the error signal ERR is generated and whether the error signal ERR which is generated in the previously performed processing and stored in the error signal memory circuit 211 is generated.

The error signal memory circuit 211 is a circuit for storing whether the error signal ERR is generated in the previously performed processing to determine whether the length of the data saving period which is previously set is appropriate or longer than the appropriate length.

Specifically, in the case where the error signal ERR in the previously performed processing is stored in the error signal memory circuit 211 and the error signal ERR is input again, the data saving period is too short. That is, in this case, the data saving period is still short even after extension. On the other hand, in the case where the error signal ERR in the previously performed processing is not stored in the error signal memory circuit 211 and the error signal ERR is input, the length of the data saving period is appropriate. That is, in this case, the data saving period becomes shorter than the appropriate length due to shortening of the data saving period.

In the case where the error signal ERR in the previously performed processing is stored in the error signal memory circuit 211 and the error signal ERR is not input, the length of the data saving period is appropriate. That is, in this case, by extending a short data saving period, the length of the data saving period becomes appropriate. On the other hand, in the case where the error signal ERR in the previously performed processing is not stored in the error signal memory circuit 211 and the error signal ERR is not input, the length of the data saving period is too much longer than the appropriate length. That is, in this case, since the length of the data saving period is too much longer than the appropriate length, the data can be saved even when the data saving period is shorten.

The data saving period determination flag memory circuit 212 is a circuit for determining the length of the data saving period in the case where the error signal memory circuit 211 determines that the data saving period has an appropriate length and for storing a determination flag for avoiding the change in the length of the data saving period even without input of the error signal ERR from then on. In the case where the data saving period determination flag memory circuit 212 stores a determination flag, the length of the data saving period can be prevented from being changed even without input of the error signal ERR. In the case where the data saving period determination flag memory circuit 212 does not store a determination flag, the length of the data saving period is changed in accordance with input of the error signal ERR.

The power gating control circuit 103 outputs the data saving signal EN_W for changing the length of the data saving period to the nonvolatile memory units 109 and 111, in accordance with a counted value of the data saving period counter 221. For example, in the case where the error signal ERR is input to the data saving period control circuit 102, a counted value of the data saving period counter 221 is incremented. On the other hand, in the case where the error signal ERR is not input to the data saving period control circuit 102, a counted value of the data saving period counter 221 is decremented.

The length of the data saving period depends on the counted value. In the case where the counted value in the data saving period counter 221 is large, the period for outputting an H-level data saving signal EN_W is adjusted to be long to extend the data saving period. On the other hand, in the case where the counted value in the data saving period counter 221 is small, the period for outputting an H-level data saving signal EN_W is adjusted to be short to shorten the data saving period.

Figure 4:
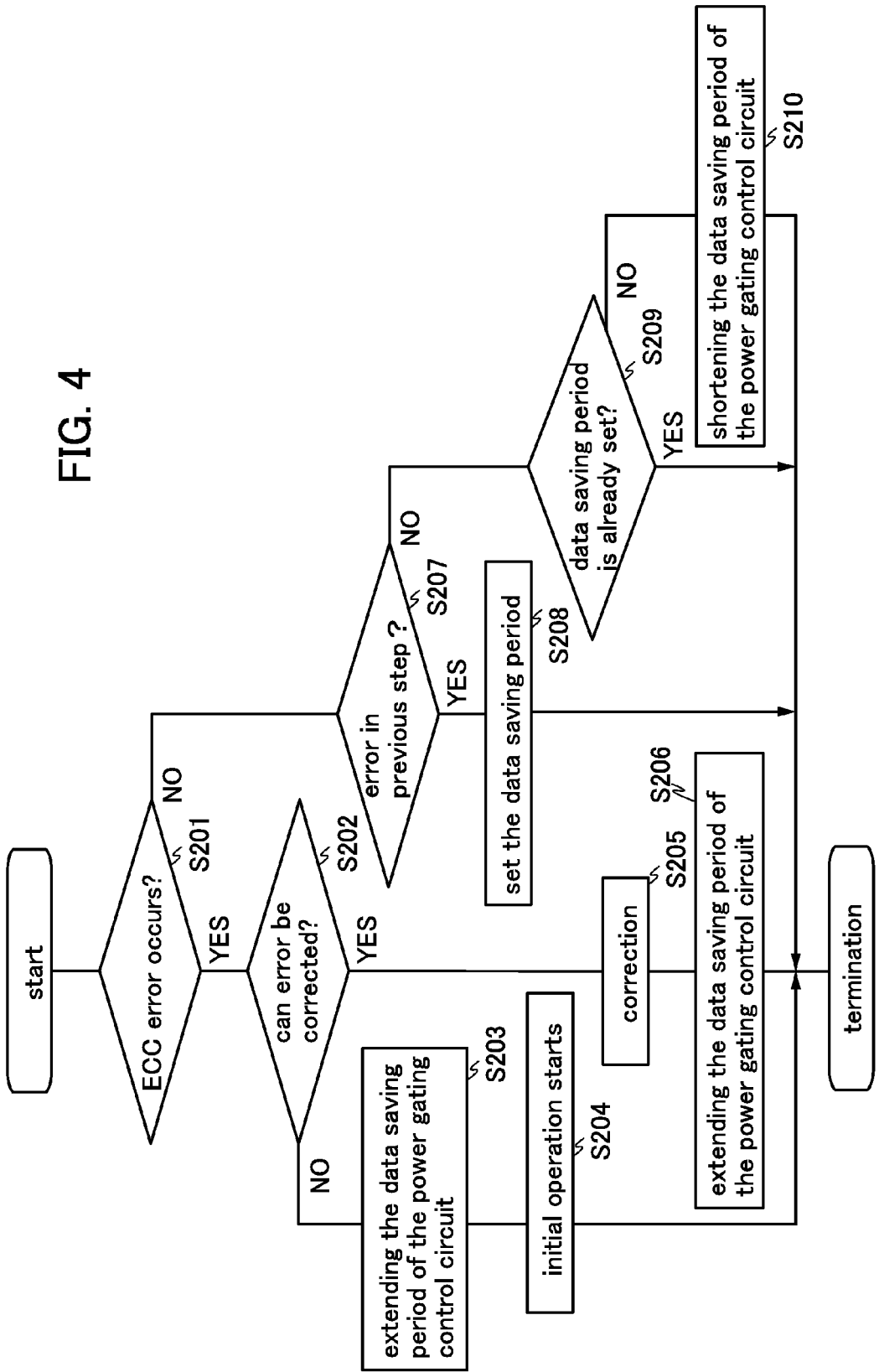
FIG. 4 is a flowchart showing an operation of a semiconductor device.

Next, FIG. 4 is a flowchart showing an example of the operation of the semiconductor device 100 illustrated in FIG. 3. The flowchart of FIG. 4 illustrates the steps S108 to S111 in the flowchart of FIG. 2 in detail. In FIG. 4, a step S201 is described as the step S108 in FIG. 2 and the following steps will be described. Note that the steps previous to the step S201 in FIG. 4 are the same as the steps S101 to S107 in the flowchart of FIG. 2.

In the step S201, the error correction code which is restored to the volatile memory unit 110 in the error correction code storage register 106 and a comparative error correction code which is calculated by the error correction code calculation circuit 201 on the basis of the data which is restored to the volatile memory unit 108 are compared to determine whether an error occurs in the error correction code. In the case where an error occurs in the error correction code, the process moves on to a step S202. In the case where an error does not occur in the error correction code, the process moves on to a step S207.

In the step S202, whether the data in the general-purpose register 105 can be corrected by the error correction code is determined. In the case where the data in the general-purpose register 105 can be corrected by the error correction code, the process moves on to a step S205. In the case where the data in the general-purpose register 105 cannot be corrected by the error correction code, the process moves on to a step S203.

In the step S203, the power gating control circuit 103 performs processing for extending the data saving period. Specifically, the data saving period control circuit 102 outputs a control signal for incrementing a counted value of the data saving period counter 221 to the data saving period counter 221 in the power gating control circuit 103. After the step S203, the process moves on to a step S204.

In the step S204, the processing which starts from an initial operation is performed. The processing is terminated after the step S204.

The initial operation means an operation by which the processing starts after data stored in the data processing circuit 101 is all reset.

In the step S205, the processing of correcting the data by the error correction code with the correction circuit 203 is performed. After the step S205, the process moves on to a step S206.

In the step S206, the power gating control circuit 103 performs processing for extending the data saving period. Specifically, the data saving period control circuit 102 outputs a control signal for incrementing a counted value of the data saving period counter 221 to the data saving period counter 221 in the power gating control circuit 103. The processing is terminated after the step S206.

In a step S207, whether the error signal ERR in the previously performed processing is generated in the error signal memory circuit 211 is determined. Specifically, whether the error signal ERR which is previously input is generated is determined in the error signal memory circuit 211. In the case where the error signal ERR which is previously input is generated, the process moves on to a step S208. In the case where the error signal ERR which is previously input is generated, the process moves on to a step S209.

In the step S208, the processing for determining the length of the data saving period is performed. Specifically, by storing a determination flag in the data saving period determination flag memory circuit 212, a counted value of the data saving period counter 221 in the power gating control circuit 103 is fixed to make the length of the data saving period based on the data saving signal EN_W to be a certain value. The processing is terminated after the step S208.

In the step S209, whether the length of the data saving period is already set is determined by the data stored in the data saving period determination flag memory circuit 212. Specifically, whether the length of the data saving period is already set is determined depending on whether the determination flag in the data saving period determination flag memory circuit is generated. The processing is terminated when the length of the data saving period is already set. The process moves on to a step S210 when the length of the data saving period does not set.

In the step S210, the power gating control circuit 103 performs processing for shortening the data saving period. Specifically, the data saving period control circuit 102 outputs a control signal for decrementing a counted value of the data saving period counter 221 to the data saving period counter 221 in the power gating control circuit 103. The processing is terminated after the step S210.

The above is the description of a flowchart of an example of the operation when the length of the data saving period of the semiconductor device 100 is changed.

With the structure described in this embodiment, an appropriate data saving period for saving data from a volatile memory unit to a nonvolatile memory unit in a semiconductor device in which the stop and restart of supply of power are alternately performed can be set, regardless of variation in characteristics in manufacturing the semiconductor device.

Embodiment 3

Figure 5A:
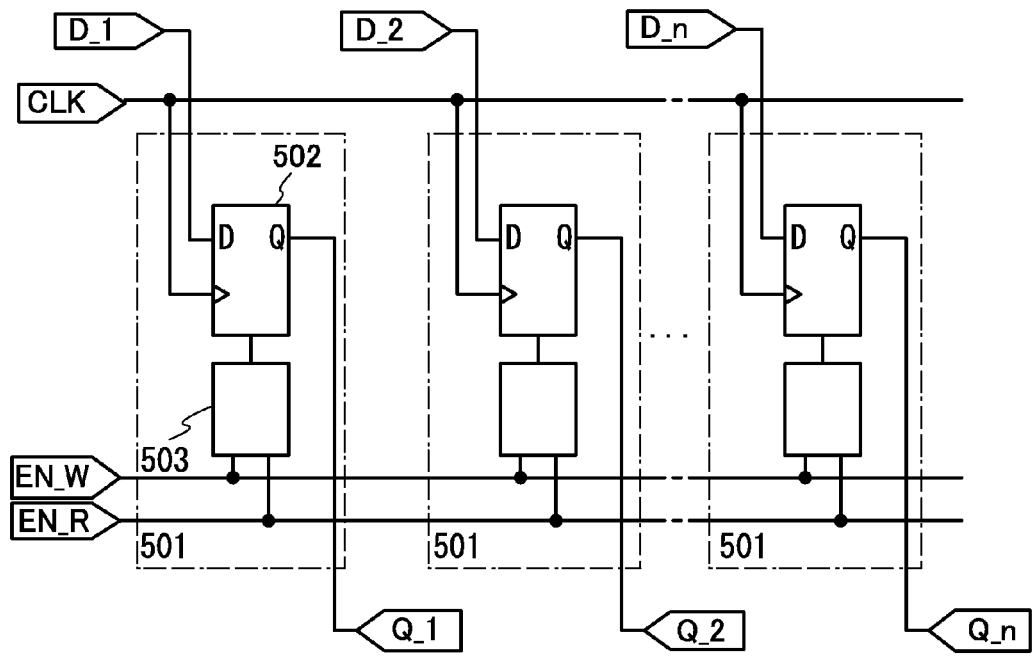
FIGS. 5A and 5B are circuit diagrams illustrating structural examples of a nonvolatile memory unit.
Figure 5B:
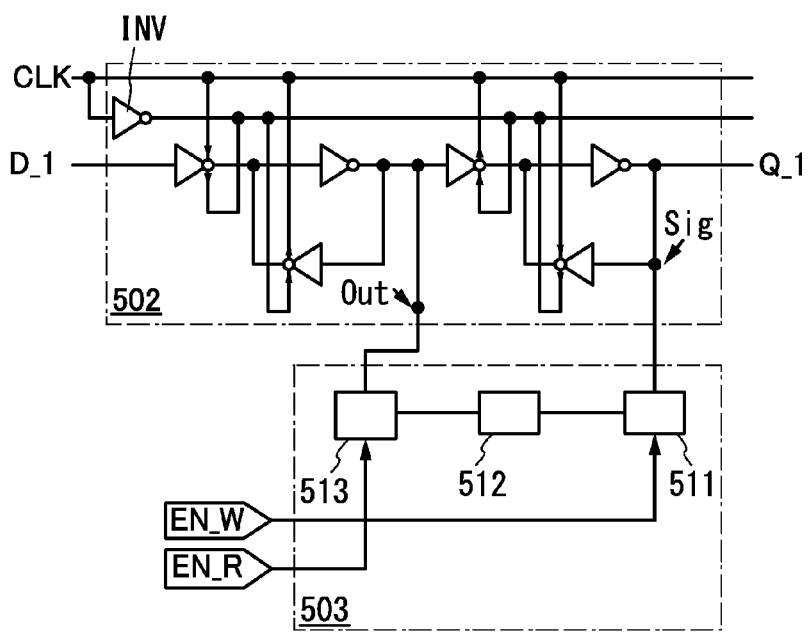

In this embodiment, the structures of the volatile memory unit and the nonvolatile memory unit which are described in Embodiment 1 and Embodiment 2 will be described. FIGS. 5A and 5B each show an example of a block diagram of the volatile memory unit and the nonvolatile memory unit.

Description is made on a block diagram of a volatile memory unit and a nonvolatile memory unit which store n-bit data (n is a natural number) with reference to FIG. 5A. Then, the structures of a volatile memory unit and a nonvolatile memory unit which store 1-bit data will be described with reference to FIG. 5B.

FIG. 5A is an example of a block diagram of a volatile memory unit and a nonvolatile memory unit. Volatile memory units and nonvolatile memory units which are illustrated in FIG. 5A can be represented by n unit memory sections 501. A unit memory section 501 including the set of the volatile memory unit and the nonvolatile memory unit is capable of storing one-bit or plural-bit data.

The unit memory sections 501 illustrated in FIG. 5A each include a volatile memory unit 502 and a nonvolatile memory unit 503.

For example, the volatile memory unit 502 can be formed using a flip-flop. In FIG. 5A, a D-flip-flop is used as the flip-flop. Power is supplied from the high power supply potential VDD and the ground potential GND to the volatile memory unit 502, and a clock signal CLK and data D_1 to D_n are input to the volatile memory unit 502. Another signal for control may be input in accordance with the circuit configuration of the volatile memory unit 502. The data D_1 to D_n input into terminals D of the volatile memory units 502 are stored and output from output terminals Q_1 to Q_n in synchronization with the clock signal.

Power is supplied from the high power supply potential VDD and the ground potential GND to the nonvolatile memory unit 503, and the data saving signal EN_W, a data restoration signal EN_R, and the data which is stored in the volatile memory unit 502 are input to the nonvolatile memory unit 503. Another signal for control may be input in accordance with the circuit configuration of the nonvolatile memory unit 503. The data stored in the nonvolatile memory unit 503 can be read and write by controlling the data saving signal EN_W and the data restoration signal EN_R.

As a nonvolatile memory element included in the nonvolatile memory unit 503, a flash memory, a FeRAM, an MRAM, a PRAM, a ReRAM, or the like can be used.

It is particularly preferable to use, as the nonvolatile memory element used for the nonvolatile memory unit 503, a nonvolatile memory element including a circuit which stores data by holding electrical charge with the use of a transistor including an oxide semiconductor layer. When the transistor including an oxide semiconductor layer is used for forming the nonvolatile memory unit 503, the nonvolatile memory unit 503 can be manufactured through a manufacturing process of the transistor; thus, cost for manufacturing the storage circuit can be reduced.

The data saving signal EN_W and the data restoration signal EN_R are signals for controlling writing and reading out of data to the nonvolatile memory element of the nonvolatile memory unit 503. Specifically, the data saving signal EN_W and the data restoration signal EN_R switch on/off of each switch or transistor included in the nonvolatile memory unit 503 to switch an electrical signal applied to the nonvolatile memory element, whereby writing or reading is performed.

Note that the data saving signal EN_W and the data restoration signal EN_R are output from the power gating control circuit 103. The data saving signal EN_W and the data restoration signal EN_R are output depending on the level of the power gating control signal EN_PG. As described in the above embodiments, the duty ratio of an H-level signal of the data saving signal EN_W is adjusted to be low in the case of a large counted value of the data saving period counter 221, whereas the duty ratio of an H-level signal of the data restoration signal EN_W is adjusted to be low in the case of a small counted value of the data saving period counter 221, for example. The length of the data saving period can be changed in accordance with the length of a period for outputting an H-level signal.

Next, a specific circuit configuration of the volatile memory unit 502 and the nonvolatile memory unit 503 included in the unit memory section 501 in FIG. 5A is illustrated in FIG. 5B.

FIG. 5B illustrates a flip-flop including a combination of inverters and clocked inverters, as a specific circuit configuration of the volatile memory unit 502. Note that in FIG. 5B, by inputting the clock signal CLK to an inverter INV, an inverted clock signal is generated. An inverted clock signal may be input from an external portion.

Note that in FIG. 5B, in the case where data stored in the volatile memory unit 502 is written in the nonvolatile memory unit 503 to stop the supply of power to the unit memory section 501, the potential of a node Sig is sampled as data. In addition, in the case where the data stored in the nonvolatile memory unit 503 is read out to the volatile memory unit 502 to restart the supply of power to the unit memory section 501, a potential corresponding to the data is output to a node Out.

The nonvolatile memory unit 503 illustrated in FIG. 5B includes a writing control circuit 511, a nonvolatile memory element 512, and a reading control circuit 513.

The writing control circuit 511 is a circuit for switching a signal which is output to the nonvolatile memory element 512 depending on the data stored in the volatile memory unit 502. Specifically, for example, in the case where the nonvolatile memory element 512 is a ReRAM, the writing control circuit 511 is a circuit for switching the polarity of a writing voltage which is applied to both ends of the ReRAM, depending on the data. The writing control circuit 511 is controlled by the data saving signal EN_W and the data.

Examples of the nonvolatile memory element 512 are a flash memory, a FeRAM, an MRAM, a PRAM, and a ReRAM. Alternatively, a nonvolatile memory element including a circuit which stores data by holding electrical charge using a transistor including an oxide semiconductor layer may be used.

The reading control circuit 513 is a circuit for switching a signal which is output to the volatile memory unit 502, depending on the data stored in the nonvolatile memory element 512. Specifically, for example, in the case where the nonvolatile memory element 512 is a ReRAM, a high resistance state and a low resistance state is switched, depending on the written data. The reading control circuit 513 is a circuit for extracting the data which is stored as the level of the resistance of the ReRAM as a voltage value using resistive division using a constant current source or a resistance element, by receiving the data restoration signal EN_R.

Note that the unit memory section 501 described using FIG. 5A can hold data even when not powered. Therefore, the supply of power can be stopped intermittently without loss of data of the general-purpose register 105 and the error correction code storage register 106 included in the data processing circuit 101 described in FIG. 1 or FIG. 3. Therefore, the supply of power is performed only in a period needed for data processing and can be stopped as appropriate depending on the usage.

Next, circuit operation of the nonvolatile memory unit 503 described in FIG. 5B included in the unit memory section 501 is described with reference to a timing chart.

Figure 6:
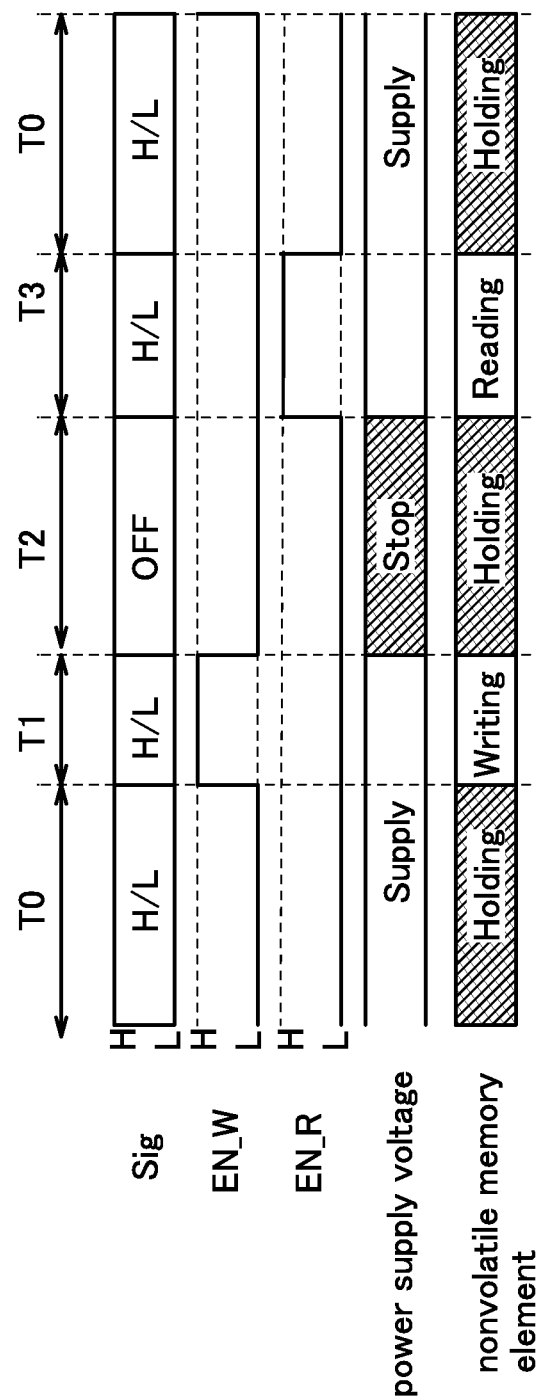
FIG. 6 is a timing chart illustrating structural examples of a nonvolatile memory unit.

The timing chart in FIG. 6 shows the potential of the node Sig of the volatile memory unit 502 illustrated in FIG. 5B, the potential of the data saving signal EN_W, the potential of the data restoration signal EN_R, the data storing state of supply or stop of a power supply voltage, and a status of the nonvolatile memory element.

Note that in FIG. 6, a potential of each signal is described using two levels, that is, an H level and an L level. In addition, in FIG. 6, "H/L" in the node Sig indicates that the potential of data has a value of either H level or L level in a period in which the volatile memory unit 502 operates; "OFF" in the node Sig indicates the state in which no data is stored because the supply of the power supply voltage to the volatile memory unit 502 is stopped.

Furthermore, in FIG. 6, the reading control circuit 513 and the writing control circuit 511 are in an operation state when the data saving signal EN_W is at H level and/or when the data restoration signal EN_R is at H level; the reading control circuit 513 and the writing control circuit 511 are in a non-operation state when the data saving signal EN_W is at L level and/or when the data restoration signal EN_R is at L level.

In FIG. 6, as for the presence or absence of the supply of the power supply voltage, a period during which power is supplied is denoted by "Supply", and a period during which power is not supplied is denoted by "Stop". Further, holding, writing, and reading data of the nonvolatile memory element are denoted by "Holding", "Writing", and "Reading", respectively.

A period T0 represents the one in which the power supply voltage is supplied to the unit memory section 501 and the volatile memory unit 502 operates to hold data. In the period T0, the data saving signal EN_W is at the L level, the data restoration signal EN_R is at the L level, and the power supply voltage is supplied. Note that the nonvolatile memory element stores data which has been written in the preceding period, which is denoted by "Holding" in the period T0.

A period T1 represents the one in which the power supply voltage is supplied to the unit memory section 501 and the data having H level or L level (H/L) which is stored in the volatile memory unit 502 is written in the nonvolatile memory element. In the period T1, the data saving signal EN_W is at the H level, the data restoration signal EN_R is at the L level, and the power supply voltage is supplied. Note that in the period T1, data corresponding to the data stored in the volatile memory unit 502 is written in the nonvolatile memory element.

As described in the above embodiments, the length of the data saving period can be changed by adjusting the period T1 for outputting an H-level data saving signal EN_W. For example, the period T1 for outputting an H-level data saving signal EN_W is adjusted to be long in the case of a large counted value of the data saving period counter 221 while being adjusted to be short in the case of a small counted value of the data saving period counter 221, for example. The length of the data saving period can be changed in accordance with the length of a period for outputting an H-level signal.

A period T2 represents the one in which the nonvolatile memory element 512 stores the data which has been written in the period T1 and thus the data is not lost even the supply of the power supply voltage to the unit memory section 501 is stopped. In the period T2, data is not input from the volatile memory unit 502 (OFF), the data saving signal EN_W is at the L level, the data restoration signal EN_R is at the L level, and the power supply voltage is not supplied. Note that the nonvolatile memory element stores the data which has been written in the period T1, which is denoted by "Holding" in the period T2.

A period T3 represents the one in which the supply of the power supply voltage to the unit memory section 501 is restarted and the data having H level or L level (H/L) which has been written in the nonvolatile memory element is read out so as to be stored again in the volatile memory unit 502. In the period T3, the data (H/L) which is read from the nonvolatile memory unit 503 is stored in the volatile memory unit 502, the data saving signal EN_W is set to L level, and the data restoration signal EN_R is set to H level, whereby the supply of the power supply voltage is performed. Note that the reading from the nonvolatile memory element is performed data corresponding to the data stored in the nonvolatile memory unit 503 in the period T3.

Note that the length of the period T3 for outputting an H-level data restoration signal EN_R may be changed to change a data restoration period, like the data saving signal EN_W. The data restoration period can be changed in accordance with the length of a period for outputting an H-level data restoration signal EN_R.

The above is the description of the timing chart of the specific circuit operation of the nonvolatile memory unit 503 included in the unit memory section 501 illustrated in FIG. 5B.

Next, an example of a possible circuit configuration of the nonvolatile memory element 512 in FIG. 5B is described with reference to FIGS. 7A and 7B.

Figure 7A:
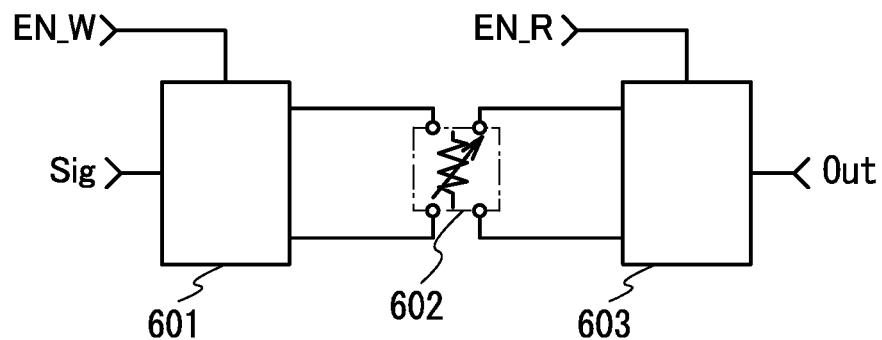
FIGS. 7A and 7B are circuit diagrams illustrating structural examples of a nonvolatile memory unit.

FIG. 7A illustrates the case where a variable resistance memory element 602 is used as the nonvolatile memory element. The data saving signal EN_W and the potential of the node Sig which is data of the volatile memory unit 502 are input to a writing control circuit 601. Further, the data restoration signal EN_R is input to a reading control circuit 603 and data corresponding to the level of the resistance value of the variable resistance memory element 602 is output to the node Out.

The writing control circuit 601 is a circuit for switching a signal which is output to the variable resistance memory element 602, depending on the potential of the node Sig. Specifically, in the case where the variable resistance memory element 602 is a ReRAM, the polarity of a writing potential applied to both ends of the variable resistance memory element 602 is switched depending on data. In the case where the variable resistance memory element 602 is an MRAM, the direction of a current flowing to the both ends is switched depending on the data.

The reading control circuit 603 is a circuit for switching a signal which is to be output to the volatile memory unit 502, depending on the data stored in the variable resistance memory element 602. Specifically, the data which is stored as the level of the resistance value of the variable resistance memory element 602 is extracted as a voltage value using a constant current source, a resistive dividing method with the use of a resistor, or the like.

Figure 7B:
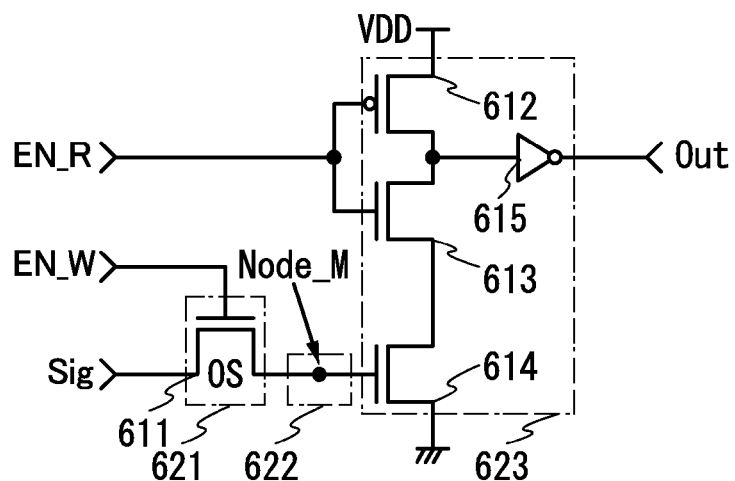

FIG. 7B is an example of a circuit which stores data by holding electrical charge using a transistor including an oxide semiconductor layer. The circuit illustrated in FIG. 7B includes a transistor including an oxide semiconductor layer (hereinafter referred to as an OS transistor 611), a p-channel transistor 612, an n-channel transistor 613, an n-channel transistor 614, and an inverter 615. In FIG. 7B, "OS" is written beside the OS transistor 611 in order to indicate that the OS transistor 611 includes an oxide semiconductor layer.

Here, an oxide semiconductor used for the semiconductor layer of the OS transistor 611 is described in detail.

At least indium (In) or zinc (Zn) is preferably contained as an oxide semiconductor used for a channel formation region in the semiconductor layer of the transistor. In particular, the metal oxide material preferably contains In and Zn. A stabilizer for strongly bonding oxygen is preferably contained in addition to In and Zn. As a stabilizer, at least one of gallium (Ga), tin (Sn), zirconium (Zr), hafnium (HD, and aluminum (Al) may be contained.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, the following can be used, for example: an In—Sn—Ga—Zn-based oxide, an In—Ga—Zn-based oxide, an In—Sn—Zn-based oxide, an In—Zr—Zn-based oxide, an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, an In-based oxide, a Sn-based oxide, or a Zn-based oxide.

Note that here, for example, an In—Ga—Zn-based oxide refers to an oxide mainly containing In, Ga, and Zn, and there is no limitation on the ratio of In to Ga and Zn.

Alternatively, a material represented by $InMO_3(ZnO)_m$ (m>0 is satisfied) may be used as an oxide semiconductor. Note that M represents one or more metal elements selected from Ga, Fe, Mn, and Co. Still alternatively, a material represented by $In_2SnO_5(ZnO)_n$ (n>0 is satisfied, and n is an integer) may be used as an oxide semiconductor.

For example, an In—Ga—Zn-based oxide with an atomic ratio of In:Ga:Zn=3:1:2, 1:1:1, or 2:2:1, or an oxide whose atomic ratio is in the neighborhood of the above atomic ratios can be used. Alternatively, an In—Sn—Zn-based oxide with an atomic ratio of In:Sn:Zn=1:1:1, In:Sn:Zn=2:1:3, or In:Sn:Zn=2:1:5, or an oxide with an atomic ratio close to the above atomic ratios may be used.

Note that for example, the expression "the composition of an oxide with an atomic ratio of In:Ga:Zn=a:b:c (a+b+c=1) is close to the composition of an oxide with an atomic ratio of In:Ga:Zn=A:B:C (A+B+C=1)" means that a, b, and c satisfy Equation 1.

$$(a-A)^2+(b-B)^2+(c-C)^2 \leq r^2 \quad \text{(Equation 1)}$$

For example, r may be 0.05. The same applies to other oxides.

However, the composition of the oxide semiconductor is not limited to those described above, and an oxide semiconductor having an appropriate composition may be used depending on necessary semiconductor characteristics (e.g., field-effect mobility or threshold voltage). In order to obtain the required semiconductor characteristics, it is preferable that the carrier concentration, the impurity concentration, the defect density, the atomic ratio between a metal element and oxygen, the interatomic distance, the density, and the like be set to appropriate values.

When an oxide semiconductor is highly purified, the off-state current of a transistor using such an oxide semiconductor for a channel formation region in a semiconductor layer can be sufficiently reduced (here, the off-state current means a drain current when a potential difference between a source and a gate is equal to or lower than the threshold voltage in the off state, for example). A highly purified oxide semiconductor can be obtained, for example, in such a manner that a film is deposited while heating is performed so as to prevent hydrogen and a hydroxyl group from being contained in the oxide semiconductor, or heat treatment is performed after film deposition so as to remove hydrogen and a hydroxyl group from the film. In the case where a highly purified In—Ga—Zn-based-oxide semiconductor is used for a channel region of a transistor having a channel length of 10 μm, a semiconductor film thickness of 30 nm, and a drain voltage of about 1 V to 10 V, the off-state current of the transistor can be reduced to $1 \times 10^{-13}$ A or less. In addition, the off-state current per channel width (the value obtained by dividing the off-state current by the channel width of the transistor) can be made about $1 \times 10^{-23}$ A/μm (10 yA/μm) to $1 \times 10^{-22}$ A/μm (100 yA/μm).

Figure 8:
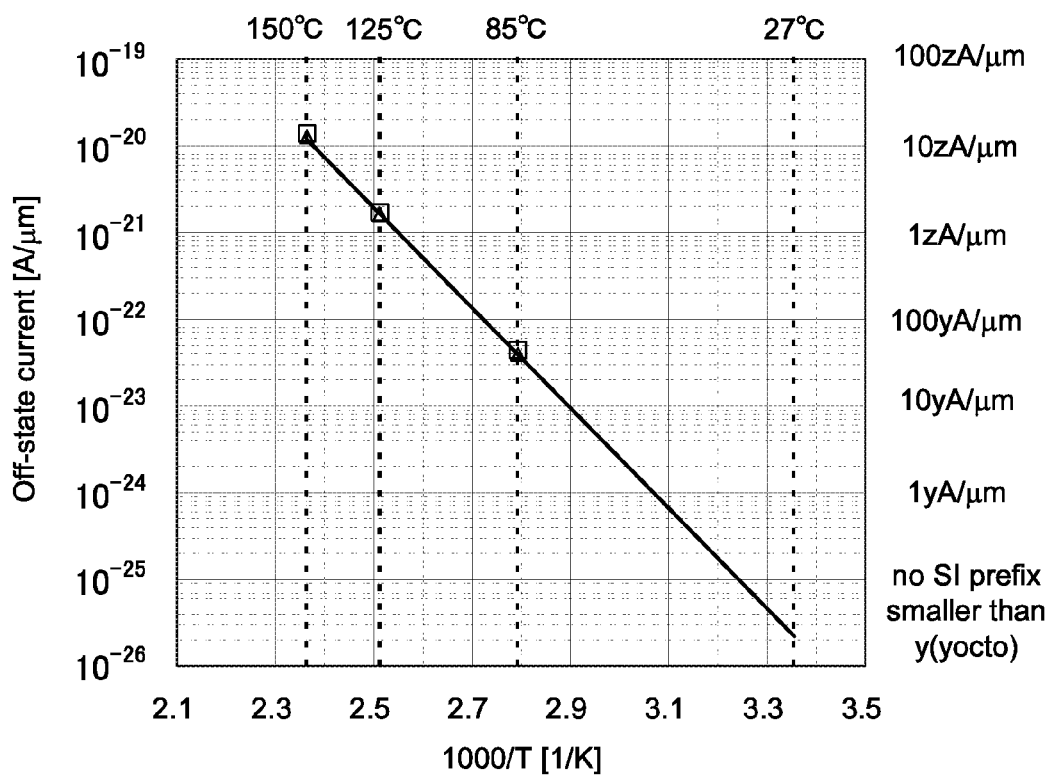
FIG. 8 is an Arrhenius plot for illustrating off-state current.

In order to detect extremely low off-state current due to the use of a highly purified oxide semiconductor, a relatively large transistor is fabricated to measure the off-state current, whereby an off-state current that actually flows can be estimated. FIG. 8 shows an Arrhenius plot of the off-state current per channel width W of 1 μm of a large transistor having a channel width W of 1 m (1000000 μm) and a channel length L of 3 μm when the temperature changes to 150° C., 125° C., 85° C., and 27° C. As seen from FIG. 8, it is found that the off-state current is as extremely small as $3 \times 10^{-26}$ A/μm. The reason the off-state current is measured at elevated temperature is that a very low current at room temperature cannot be measured.

The deposited oxide semiconductor film is in a single crystal state, a polycrystalline (also referred to as polycrystal) state, an amorphous state, or the like.

The above is the description of the oxide semiconductor used for the semiconductor layer of the OS transistor 611.

In the circuit illustrated in FIG. 7B, one of a source and a drain of the OS transistor 611 is connected to a wiring supplied with the potential of the node Sig that is the data of the volatile memory unit 502. A gate of the OS transistor 611 is connected to a wiring to which the data saving signal EN_W is input. The other of the source and the drain of the OS transistor 611 is connected to a gate of the n-channel transistor 614.

Note that a node where the other of the source and the drain of the OS transistor 611 and the gate of the n-channel transistor 614 are connected to each other is referred to as a node_M. Turning off the OS transistor 611 enables the node_M to hold electrical charge corresponding to the data of the volatile memory unit 502.

Note that it is preferable that the OS transistor 611 have a small drain current when the gate voltage is 0 V. In a manner similar to the off-state current, the drain current at this condition is preferably approximately $1 \times 10^{-23}$ A/μm (10 yA/μm) to $1 \times 10^{-22}$ A/μm (100 yA/μm). Therefore, it is preferable that the threshold voltage of the OS transistor 611 be positively shifted. Specifically, the positive shift of the threshold voltage can be achieved in such a manner that a back gate electrode is provided in the OS transistor and a negative bias is applied to a channel formation region of the OS transistor.

In the circuit illustrated in FIG. 7B, one of a source and a drain of the p-channel transistor 612 is connected to a wiring supplied with the high power supply potential VDD. A gate of the p-channel transistor 612 is connected to a wiring to which the data restoration signal EN_R is input. The other of the source and the drain of the p-channel transistor 612 is connected to one of a source and a drain of the n-channel transistor 613.

In the circuit illustrated in FIG. 7B, a gate of the n-channel transistor 613 is connected to the wiring to which the data restoration signal EN_R is input. The other of the source and the drain of the p-channel transistor 612 is connected to one of a source and a drain of the n-channel transistor 614.

In the circuit illustrated in FIG. 7B, the other of the source and the drain of the n-channel transistor 614 is connected to a ground line.

In the circuit illustrated in FIG. 7B, an input terminal of the inverter 615 is connected to the other of the source and the drain of the p-channel transistor 612 and the one of the source and the drain of the n-channel transistor 613. An output terminal of the inverter 615 is connected to the node Out.

In the circuit illustrated in FIG. 7B, the OS transistor 611 is a writing control circuit 621, the node_M is a nonvolatile memory element 622, and the p-channel transistor 612, the n-channel transistor 613, the n-channel transistor 614, and the inverter 615 are a reading control circuit 623. In other words, the writing control circuit 621 stores electrical charge in the node_M that is the nonvolatile memory element 622, in accordance with the data saving signal EN_W. The reading control circuit 623 can output a signal in accordance with the data to the node OUT, depending on the electrical charge stored in the nonvolatile memory element 622.

The above described structures of the volatile memory unit and the nonvolatile memory unit can be used for the structures described in Embodiment 1 and Embodiment 2.

This embodiment can be implemented by being combined as appropriate with any of other embodiments.

Embodiment 4

Figure 9:
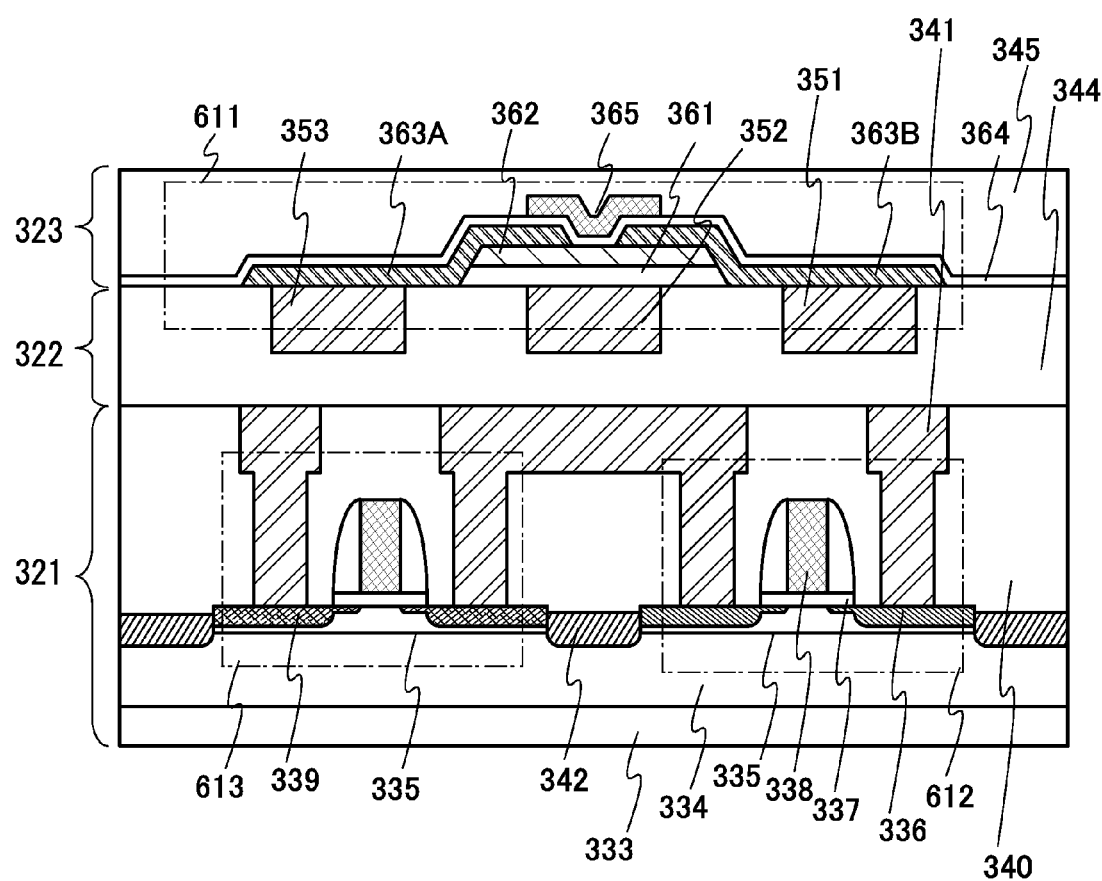
FIG. 9 is a cross-sectional view of transistors included in a semiconductor device.

In this embodiment, FIG. 9 illustrates a cross section of a semiconductor device where the OS transistor 611 described in Embodiment 3 is stacked with the n-channel transistor 613 and the p-channel transistor 612 which are described in Embodiment 3. The semiconductor device will be described below.

Note that a cross-sectional view of the structure of the semiconductor device illustrated in FIG. 9 shows the n-channel transistor 613 and the p-channel transistor 612 as examples of transistors in a control circuit which form a lower portion and the OS transistor 611 in which a channel is formed in an oxide semiconductor layer as a transistor which forms an upper portion.

In the semiconductor device illustrated in FIG. 9, a lower element layer 321 includes the n-channel transistor 613 and the p-channel transistor 612 where silicon material is used in a channel formation region, and an upper element layer 323 includes the OS transistor 611. A wiring layer 322 is laid between the lower element layer 321 and the upper element layer 323.

The n-channel transistor 613 in FIG. 9 includes an SOI layer 335 provided over a substrate 333 including a semiconductor material (e.g., silicon) with a BOX layer 334 provided therebetween, n-type impurity regions 336 formed in the SOI layer 335, a gate insulating layer 337, and a gate electrode 338. Although not illustrated, the SOI layer 335 includes intermetallic compound regions and a channel formation region in addition to the n-type impurity regions 336. In the p-channel transistor 612, p-type impurity regions 339 are formed in the SOI layer 335.

An element isolation insulating layer 342 is provided between the SOI layers 335 of the n-channel transistor 613 and the p-channel transistor 612, and an insulating layer 340 is provided to cover the n-channel transistor 613 and the p-channel transistor 612. Note that in the n-channel transistor 613 and the p-channel transistor 612, sidewalls are formed on side surfaces of the gate electrode 338 as illustrated in FIG. 9, and regions having different concentrations of impurities may be included in the n-type impurity regions 336 and the p-type impurity regions 339.

The insulating layer 340 which is provided over the n-type impurity region 336 and the p-type impurity region 339 has openings. The wiring 341 is provided to fill the openings. In the wiring layer 322 over the insulating layer 340 and the wiring 341, an insulating layer 344, a wiring 351, a wiring 352, and a wiring 353 are provided. The wiring 351 can function as a source electrode of the OS transistor 611. The wiring 352 can function as a gate electrode of the OS transistor 611. The wiring 353 can function as a drain electrode of the OS transistor 611.

Note that the wiring 341 which is in the insulating layer 340 of the lower element layer 321, the wiring 351, the wiring 352, and the wiring 353 which are in the insulating layer 344 of the wiring layer 322 may be formed by a dual damascene method. Further, a contact plug may be formed to connect different wiring layers.

The n-channel transistor 613 and the p-channel transistor 612 each of which includes the SOI layer 335 including a semiconductor material can be operated at high speed and can be reduced in size as compared to the OS transistor 611.

A top surface of the wiring layer 322 may be subjected to chemical mechanical polishing (CMP) treatment to form the OS transistor 611.

The OS transistor 611 includes a gate insulating layer 361 and an oxide semiconductor film 362 which are formed over the insulating layer 344 and the wiring 352 to have an island shape and be stacked with each other. The OS transistor 611 includes a source electrode 363A which is over the island-shaped gate insulating layer 361 and the island-shaped oxide semiconductor film 362 and is connected to the wiring 353, and a drain electrode 363B which is over the island-shaped gate insulating layer 361 and the island-shaped oxide semiconductor film 362 and is connected to the wiring 351. The OS transistor 611 includes the insulating layer 364 over the island-shaped gate insulating layer 361, the island-shaped oxide semiconductor film 362, the insulating layer 344, the source electrode 363A, and the drain electrode 363B. The OS transistor 611 includes a back gate electrode 365 over the island-shaped gate insulating layer 361 and the island-shaped oxide semiconductor film 362 with the insulating layer 364 laid therebetween. The OS transistor 611 is covered with an insulating layer 345.

In the OS transistor 611 including the back gate electrode 365, a back gate voltage can be applied to the back gate electrode 365 to control the threshold voltage of the OS transistor 611. With the structure, the off-state current of the OS transistor 611 can be surely reduced.

As described above, in the semiconductor device in this embodiment, the transistors whose channel formation regions are formed using silicon and the transistor whose channel formation region is formed using the oxide semiconductor film can be stacked. As a result, a space for each element can be saved and thus the size of the semiconductor device can be reduced.

This embodiment can be implemented by being combined as appropriate with any of the above-described embodiments.

This application is based on Japanese Patent Application serial no. 2012-125651 filed with Japan Patent Office on Jun. 1, 2012, the entire contents of which are hereby incorporated by reference.

What is claimed is:

1. A semiconductor device comprising:
a first circuit;
a second circuit electrically connected to the first circuit; and
a third circuit comprising:
a first register electrically connected to the second circuit, the first register comprising a first volatile memory unit and a first nonvolatile memory unit;
a second register electrically connected to the second circuit, the second register comprising a second volatile memory unit and a second nonvolatile memory unit; and
a fourth circuit electrically connected to the first circuit, the first register and the second register,
wherein the first nonvolatile memory unit is configured to save a data from the first volatile memory unit during a data saving period,
wherein the second circuit is configured to determine a length of the data saving period,
wherein the fourth circuit is configured to send a first signal to the first circuit, and
wherein the first circuit is configured to send a second signal to the second circuit to change the length of the data saving period on the basis of the first signal.

2. The semiconductor device according to claim 1, wherein the first signal is an error signal.

3. The semiconductor device according to claim 1, wherein the fourth circuit comprises:
a fifth circuit electrically connected to the first register;
a sixth circuit electrically connected to the second register and the fifth circuit; and
a seventh circuit electrically connected to the first register and the sixth circuit,
wherein the fifth circuit is configured to generate a first code and a second code,
wherein the sixth circuit is configured to compare the first code and the second code and output a comparison result, and
wherein the seventh circuit is configured to correct the data in the first register.

4. The semiconductor device according to claim 3, wherein the first circuit comprises:
an eighth circuit electrically connected to the sixth circuit; and
a ninth circuit electrically connected to the third circuit,
wherein the eighth circuit is configured to hold the comparison result, and
wherein the ninth circuit is configured to hold a flag to determine the length of the data saving period.

5. The semiconductor device according to claim 1, wherein the second circuit comprises a data saving period counter,
wherein the first circuit is configured to control the data saving period counter, and
wherein the data saving period counter is configured to control supply of power to the third circuit.

6. The semiconductor device according to claim 3, wherein the first nonvolatile memory unit and the second nonvolatile memory unit are configured to store the data and the first code by storage of electric charge.

7. The semiconductor device according to claim 1,
wherein the first nonvolatile memory unit and the second nonvolatile memory unit comprise a transistor including an oxide semiconductor layer.

8. A semiconductor device comprising:
a data saving period control circuit;
a power gating control circuit; and
a data processing circuit comprising:
  a general-purpose register;
  an error correction code storage register; and
  an error correction code circuit,
wherein the general-purpose register and the error correction code storage register each comprise a volatile memory unit and a nonvolatile memory unit,
wherein the data saving period control circuit is configured to output a first signal to the power gating control circuit depending upon whether an error in an error correction code stored in the error correction code storage register is detected by the error correction code circuit,
wherein the power gating control circuit is configured to output a second signal for changing a length of a data saving period depending upon the signal from the data saving period control circuit, and
wherein data is saved from the volatile memory unit to the nonvolatile memory unit during the data saving period in the general-purpose register.

9. The semiconductor device according to claim 8,
wherein the error correction code circuit comprises:
  an error correction code calculation circuit;
  an error correction code comparison circuit; and
  a correction circuit,
wherein the error correction code calculation circuit is configured to generate the error correction code,
wherein the error correction code comparison circuit is configured to calculate a comparative error correction code being calculated using the data stored in the nonvolatile memory unit in the general-purpose register,
wherein the error correction code comparison circuit is configured to output a result of comparing the comparative error correction code and the error correction code stored in the nonvolatile memory unit in the error correction code storage register, and
wherein the correction circuit is configured to correct the data which is stored in the general-purpose register in accordance with the error correction code.

10. The semiconductor device according to claim 9, wherein the data saving period control circuit comprises:
an error signal memory circuit; and
a data saving period determination flag memory circuit,
wherein the error signal memory circuit is configured to hold the result of comparing the comparative error correction code and the error correction code stored in the nonvolatile memory unit in the error correction code storage register, and
wherein the data saving period determination flag memory circuit is configured to hold a determination flag of the data saving period determined on the basis of the result of comparing the comparative error correction code and the error correction code stored in the nonvolatile memory unit in the error correction code storage register.

11. The semiconductor device according to claim 8,
wherein the power gating control circuit comprises a data saving period counter which is controlled by the data saving period control circuit, and
wherein the data saving period counter is configured to control supply of power to the data processing circuit in accordance with a counted value of the data saving period counter.

12. The semiconductor device according to claim 8,
wherein a nonvolatile memory element included in the nonvolatile memory unit in the general-purpose register is a memory element which is configured to store the data by storage of electric charge using a transistor comprising an oxide semiconductor layer.

13. The semiconductor device according to claim 8,
wherein a nonvolatile memory element included in the nonvolatile memory unit in the error correction code storage register is a memory element which is configured to store the error correction code by storage of electric charge using a transistor comprising an oxide semiconductor layer.

14. A method for driving a semiconductor device, the semiconductor device comprising:
a data saving period control circuit;
a power gating control circuit; and
a data processing circuit comprising:
a general-purpose register comprising a volatile memory unit and a nonvolatile memory unit;
an error correction code storage register comprising a volatile memory unit and a nonvolatile memory unit; and
an error correction code circuit,
the method comprising the steps of:
performing a step where the power gating control circuit switches whether power is supplied to the data processing circuit and switching data saving and restoration which are conducted between the volatile memory unit and the nonvolatile memory unit in the general-purpose register and between the volatile memory unit and the nonvolatile memory unit in the error correction code storage register;
performing a step where when the error correction code circuit detects an error from an error correction code stored in the nonvolatile memory unit in the error correction code storage register, the data saving period control circuit extends a data saving period for storing data stored from the volatile memory unit to the nonvolatile memory unit in the general-purpose register; and
performing a step where when the error correction code circuit does not detect an error from an error correction code stored in the nonvolatile memory unit in the error correction code storage register, the data saving period control circuit shorten the data saving period for storing data stored from the volatile memory unit to the nonvolatile memory unit in the general-purpose register.

15. The method for driving the semiconductor device according to claim 14, wherein the error correction code circuit comprises an error correction code calculation circuit, an error correction code comparison circuit, and a correction circuit, comprising the steps of:
performing a step where the error correction code calculation circuit generates the error correction code by using the data stored in the nonvolatile memory unit in the general-purpose register before supply of power to the data processing circuit is stopped;
performing a step where the error correction code comparison circuit outputs a comparison result obtained by comparing a comparative error correction code calculated on the basis of the data stored in the nonvolatile memory unit in the general-purpose register by the error correction code calculation circuit with the error correction code stored in the nonvolatile memory unit in the error correction code storage register;
performing a step where the correction circuit detects an error in the error correction code in the comparison result in the error correction code comparison circuit and, where the correction circuit corrects the data in the general-purpose register in the case where the data stored in the nonvolatile memory unit in the general-purpose register can be corrected on the basis of the error correction code and where the data saving period control circuit extends the data saving period for storing the data stored from the volatile memory unit to the nonvolatile memory unit; and performing a step where the correction circuit detects an error in the error correction code in the comparison result in the error correction code comparison circuit and, where the data saving period for storing the data stored from the volatile memory unit to the nonvolatile memory unit in the general-purpose register is extended in the case where the data stored in the nonvolatile memory unit in the general-purpose register cannot be corrected on the basis of the error correction code.

16. The method for driving the semiconductor device, according to claim 15, wherein in the case where the data saving period control circuit does not detect an error in the error correction code stored in the nonvolatile memory unit in the error correction code storage register, the data saving period control circuit determines the length of the data saving period in accordance with whether the error is found in a previous step.

\* \* \* \* \*